(12) United States Patent
Mueller et al.

(10) Patent No.: US 11,562,789 B2
(45) Date of Patent: Jan. 24, 2023

(54) MULTIPLEXER FOR MEMORY

(71) Applicant: Infineon Technologies AG, Neubiberg (DE)

(72) Inventors: David Mueller, Unterhaching (DE); Wolf Allers, Munich (DE); Christian Peters, Vaterstetten (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 223 days.

(21) Appl. No.: 17/117,713

(22) Filed: Dec. 10, 2020

(65) Prior Publication Data
US 2021/0174868 A1 Jun. 10, 2021

(51) Int. Cl.
*G11C 17/16* (2006.01)
*G11C 17/18* (2006.01)
*G11C 13/00* (2006.01)
*G11C 7/10* (2006.01)

(52) U.S. Cl.
CPC .......... *G11C 13/004* (2013.01); *G11C 7/1012* (2013.01); *G11C 13/0026* (2013.01); *G11C 13/0028* (2013.01); *G11C 13/0038* (2013.01); *G11C 13/0069* (2013.01)

(58) Field of Classification Search
CPC . G11C 13/004; G11C 7/1012; G11C 13/0026; G11C 13/0028; G11C 13/0038; G11C 13/0069; G11C 13/0023; G11C 2213/79; G11C 2213/82; G11C 5/14; G11C 5/147; G11C 13/0097; G11C 7/12; G11C 7/16; G11C 17/18
See application file for complete search history.

(56) References Cited

U.S. PATENT DOCUMENTS

| | | | |
|---|---|---|---|
| 2005/0116222 A1* | 6/2005 | Chou | G11C 29/006 257/48 |
| 2015/0269972 A1* | 9/2015 | Tatsu | G11C 16/10 365/72 |
| 2018/0358085 A1* | 12/2018 | Em | G11C 11/4074 |
| 2019/0164606 A1 | 5/2019 | Chih | |
| 2020/0051653 A1* | 2/2020 | Kurjanowicz | H01L 23/5252 |
| 2020/0327937 A1* | 10/2020 | Nguyen | G11C 13/003 |
| 2022/0101934 A1* | 3/2022 | Sanjeevarao | G11C 8/08 |

* cited by examiner

*Primary Examiner* — Hien N Nguyen
(74) *Attorney, Agent, or Firm* — Cooper Legal Group LLC

(57) ABSTRACT

In an example, a multiplexer is provided. The multiplexer may include one or more first strings controlling access to source-lines of the memory, wherein a first string of the one or more first strings includes a first set of two high voltage transistors and a first plurality of low voltage transistors. The multiplexer may include one or more second strings controlling access to bit-lines of the memory, wherein a second string of the one or more second strings includes a second set of two high voltage transistors and a second plurality of low voltage transistors. A method for operating such multiplexer is provided.

20 Claims, 10 Drawing Sheets

Fig. 9

| | | Read-Idle (neutral) 901-903 | | | Read 904-906 | | | Set / Form 907-909 | | | Reset 910-912 | | |
|---|---|---|---|---|---|---|---|---|---|---|---|---|---|
| | | selected double | | unsel. | selected double | | unsel. | selected double | | unsel. | selected double | | unsel. |
| | | selected | double | double | selected | double | double | selected | double | double | selected | double | double |
| 921 | | | | | | | | | | | | | | |
| 922 | | | | | | | | | | | | | | |
| 923 | | | | | | | | | | | | | | |
| 924 | BL | | | | | | | | | | | | | |
| 925 | SL | | | | | | | | | | | | | |
| 926 | gsl_n | 0 | VDD | 0 | 0.2V | VDD | 0 | 2.5V | VDD (0V) | VDD | 0 | VDD (0V) | VDD |
| 927 SL | sel_sl_hv_n<31:0> | 1.5V | 1.5V | 1.5V | 1.5V | 1.5V | 1.5V | 1.5V | 0 | 0 | 0 | 2.5V / Z | 2.5V |
| 928 | sl_pos_hv | VDD | VDD | VDD | VDD | VDD | VDD | VDD | VDD | VDD | 2.5V (VDD) | 2.5V (VDD) | 2.5V (VDD) |
| 929 | bl_tievdd_n | 0 | VDD | VDD | VDD | VDD | VDD | VDD (0V) | VDD (0V) | 0 | VDD (0V) | 0 | 0 |
| 930 | sel_rd<31:0> | VDD | 0 | 0 | 0 | 0 | 0 | 0 | 0 | 0 | 0 | 0 | 0 |
| 931 | bl_tiedwn<31:0> | 0 | VDD | VDD | VDD | VDD | VDD | 0 | VDD | 0 | 0 | 0 | 0 |
| 932 BL | sel_bl_lv<63:0> | VDD | VDD | VDD | VDD | VDD | VDD | 0 | 0 | 0 | VDD | VDD | 0 |
| 933 | en_lv_pos_n<31:0> | 0 | 0 | 0 | VDD | VDD | VDD | 0 | 0 | 0 | VDD | VDD | 0 |
| 934 | vclamp_bl | 1.5V | 1.5V | 1.5V | 1.5V | 1.5V | 1.5V | VCLAMP | VCLAMP | VCLAMP | VCLAMP | VCLAMP | VCLAMP |
| 935 | sel_bl_hv_n<63:0> | 1.5V | 1.5V | 1.5V | 1.5V | 1.5V | 1.5V | 0 | 2.5V | 2.5V | 2.5V | 0 | 2.5V |
| 936 | bl_pos_hv | VDD | VDD | VDD | VDD | VDD | VDD | 2.5V (VDD) | 2.5V (VDD) | 2.5V (VDD) | 2.5V / Z (VDD) | 2.5V / Z (VDD) | 2.5V / Z (VDD) |
| 937 | rd_path | defined by SA | defined by SA | defined by SA | 0.2V defined by SA | 0.2V defined by SA | 0.2V defined by SA | defined by SA | defined by SA | defined by SA | defined by SA | defined by SA | defined by SA |

SA: Sense-Amplifier
VDD: 0.9V
Z: high impedance

MULTIPLEXER FOR MEMORY

RELATED APPLICATION

This application claims priority to German Patent Application No. 102019133737.2, filed on Dec. 10, 2019, entitled "Multiplexer for memory", which is incorporated by reference herein in its entirety.

SUMMARY

Solutions described herein refer to a multiplexer for memory, for example, an area-optimized bit-line/source-line multiplexer for memories, e.g., RRAMs. An RRAM is a resistive random-access memory, e.g., a non-volatile (NV) RAM that works by changing the resistance across a dielectric solid-state material, often referred to as a memristor.

A bit-line (BL) and source-line (SL) multiplexer (MUX) is used to connect addressed memory elements to signal paths required for memory operation such as set/form or reset. In addition, a signal path to a sense-amplifier (SA) is used for conducting read-operations. The memory elements may be part of the RRAM.

Such a multiplexer may comprise repetitive structures that may depend on the number of BLs, e.g., several thousand repetitive structures for embedded memories. Due to this large amount of repetitive parts, area optimization is one of the major objectives towards area efficient memory modules.

For set/form operations and read operations, higher voltages as a core voltage (e.g., voltages higher than a voltage threshold) may be required. Accordingly, dedicated high-voltage (HV) devices may be used for the repetitive structures. The HV devices, however, are larger (e.g., significantly larger) than core voltage device, which results in additional space (area) (e.g., a significant amount of additional space occupied by the repetitive structures).

It is noted that high-voltage in this regard refers to a positive high-voltage range from 1.5 volts (V) to 3.5V and core voltage (also "low voltage", LV) may refer to a positive supply voltage range from 0.8V to 1.3V.

Hence, reducing the number of HV devices may provide for more efficient area utilization.

A reduction of the number of HV devices and/or more efficient area utilization may be achieved according to the features of the independent claims. Further embodiments result from the depending claims.

The examples suggested herein may be based on at least one of the following solutions. Combinations of the following features may be utilized to reach a desired result. The features of the method could be combined with any feature(s) of the device, apparatus or system or vice versa.

In an example, a multiplexer is provided for controlling access to memory cells of a memory, the multiplexer comprising: one or more first strings controlling access to source-lines of the memory, wherein a first string of the one or more first strings comprises a first set of two high voltage transistors and a plurality of low voltage transistors; and one or more second strings controlling access to bit-lines of the memory, wherein a second string of the one or more second strings comprises a second set of two high voltage transistors and a second plurality of low voltage transistors.

It is noted that the memory may in addition be accessed by utilizing word lines.

Advantageously, the approach allows using two high voltage (HV) transistors (e.g., only two HV transistors) for each string. This may result in a reduction (e.g., a significant reduction) of area required on a chip. Hence, the multiplexer for the memory requires less area on the chip as compared to other solutions.

It is noted that the HV transistors are capable of enduring a voltage amounting to 2.5V, whereas the LV transistors are limited to voltages below, e.g., 1.3V.

It is noted that the transistors may be PMOS or NMOS transistors.

According to an embodiment, a high voltage control unit is configured to drive the first set of two high voltage transistors and the second set of two high voltage transistors and a low voltage control unit is configured to drive the first plurality of low voltage transistors and the second plurality of low voltage transistors.

For example, the high voltage control unit may be configured to drive high voltage transistors of the multiplexer and the low voltage control unit may be configured to drive low voltage transistors of the multiplexer.

According to an embodiment, the first set of two high voltage transistors and/or the second set of two high voltage transistors are arranged such that per string a first high voltage transistor is arranged to apply a high voltage to the memory and a second high voltage transistor is arranged in series with the low voltage transistors to protect the low voltage transistors from the high voltage.

This applies to the first string and/or the second string. Hence, the first high voltage transistor can be applied in a way that the high voltage is supplied towards (to or from) the memory and the second high voltage transistor arranged in series with the low voltage transistors ensures that a portion of the voltage is dropped across this second high voltage transistor such that a reduced voltage (e.g., only the reduced voltage) is applied to the low voltage transistors.

According to an embodiment, the first set of two high voltage transistors of the first string are arranged such that a first high voltage transistor of the first set of two high voltage transistors is arranged to apply a first voltage to the memory and a second high voltage transistor of the first set of two high voltage transistors is arranged in series with the first plurality of low voltage transistors to protect the first plurality of low voltage transistors from the first voltage. Alternatively and/or additionally, the second set of two high voltage transistors of the second string may be arranged such that a third high voltage transistor of the second set of two high voltage transistors is arranged to apply a second voltage to the memory and a fourth high voltage transistor of the second set of two high voltage transistors is arranged in series with the second plurality of low voltage transistors to protect the second plurality of low voltage transistors from the second voltage.

According to an embodiment, the first plurality of low voltage transistors and/or the second plurality of low voltage transistors are arranged such that per string the bit-lines or source-lines can be selected and that various voltages can be applied.

According to an embodiment, the first plurality of low voltage transistors of the first string are arranged such that one or more source-lines of the source-lines can be selected and first voltages can be applied to at least some of the source-lines. Alternatively and/or additionally, the second plurality of low voltage transistors of the second string may be arranged such that one or more bit-lines of the bit-lines can be selected and second voltages can be applied to at least some of the bit-lines.

According to an embodiment, the first string and the second string are used to access one or more memory cells of the memory and conduct a set/form operation, a reset operation or a read operation.

According to an embodiment, the memory is an RRAM.

According to an embodiment, the memory cells are arranged in a matrix structure. The one or more first strings may comprise a string for each row of memory cells of the memory cells of the memory. In some examples, each string of the one or more first strings comprises a set of two high voltage transistors and a plurality of low voltage transistors. The one or more second strings may comprise a string for each row of memory cells of the memory cells of the memory. In some examples, each string of the one or more second strings comprises a set of two high voltage transistors and a plurality of low voltage transistors.

In an example, the memory cells are arranged in a matrix structure and per row of memory cells, one string of the one or more first strings and one string of the one or more second strings are provided.

According to an embodiment, the memory cells are arranged in a matrix structure. The one or more first strings may comprise a string for each set of N strings of the one or more second strings. N may be a multiple of two (e.g., 2, 4, 6, 8 . . . ). Two bit-lines (and/or more than two bit-lines) of the memory may share one source-line of the memory.

In an example, the memory cells are arranged in a matrix structure and one string of the one or more first strings is provided for two or multiples of two strings of the one or more second strings such that two bit-lines share one source-line.

This enables a further reduction of area required for the multiplexer functionality. This concept is also referred to herein as shared source-line for multiple bit-lines.

According to an embodiment, the multiplexer is arranged on the same chip as the memory and/or or in the same package as the memory.

According to an embodiment, each high voltage transistor of the first set of two high voltage transistors is configured to endure a voltage higher than 1.5 V and each high voltage transistor of the second set of two high voltage transistors is configured to endure a voltage higher than 1.5 V.

For example, high voltage transistors of the multiplexer may be configured to endure a voltage higher than 1.5 V (e.g., a voltage of 2.5 V).

According to an embodiment, each low voltage transistor of the first plurality of low voltage transistors is limited to a voltage of less than 1.5 V and each low voltage transistor of the second plurality of low voltage transistors is limited to a voltage of less than 1.5 V.

For example, low voltage transistors of the multiplexer may be limited to a voltage of less than 1.5 V (e.g., 1.3 V).

In an example, a method is provided for operating a multiplexer controlling access to memory cells of a memory, wherein the multiplexer comprises a first string controlling access to source-lines of the memory, wherein the first string comprises a first set of two high voltage transistors and a first plurality of low voltage transistors; and a second string controlling access to the bit-lines of the memory, wherein the second string comprises a second set of two high voltage transistors and a second plurality of low voltage transistors, wherein the method comprises: applying voltages to the first string and the second string to conduct one or more operations on memory cells of the memory, wherein the one or more operations comprise a read operation, a set/form operation and/or a reset operation.

In an example, a multiplexer is provided for controlling access to memory cells of a memory, the multiplexer comprising: one or more first strings controlling access to source-lines of the memory, wherein a first string of the one or more first strings comprises a first set of two high voltage transistors and a plurality of low voltage transistors; and one or more second strings controlling access to bit-lines of the memory, wherein a second string of the one or more second strings comprises a second set of two high voltage transistors and a second plurality of low voltage transistors, wherein the memory is an RRAM, and wherein the first string or the second string is configured to conduct a set/form operation, a reset operation or a read operation.

DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

FIG. 9 shows a table comprising exemplary voltages at the nodes/lines shown in FIG. 8 for the various operation modes, i.e. read operation, set/form operation and reset operation;

DETAILED DESCRIPTION

Solutions described herein allow for an efficient area utilization of multiplexer circuitry, which is utilized in combination with memories, such as with RRAMs.

One or more devices and/or techniques are provided for reducing the number of HV devices, and thereby reducing the amount of space (area) that is required for repetitive structures within the multiplexer, utilized to access memory cells of the memory.

Advantageously, an exemplary multiplexer concept described herein may require one HV-PMOS (e.g., only one HV-PMOS) and one HV-NMOS (e.g., only one HV-NMOS) per bit-line (and/or other configurations of HV transistors). This may apply accordingly per source-line.

Figure 1:
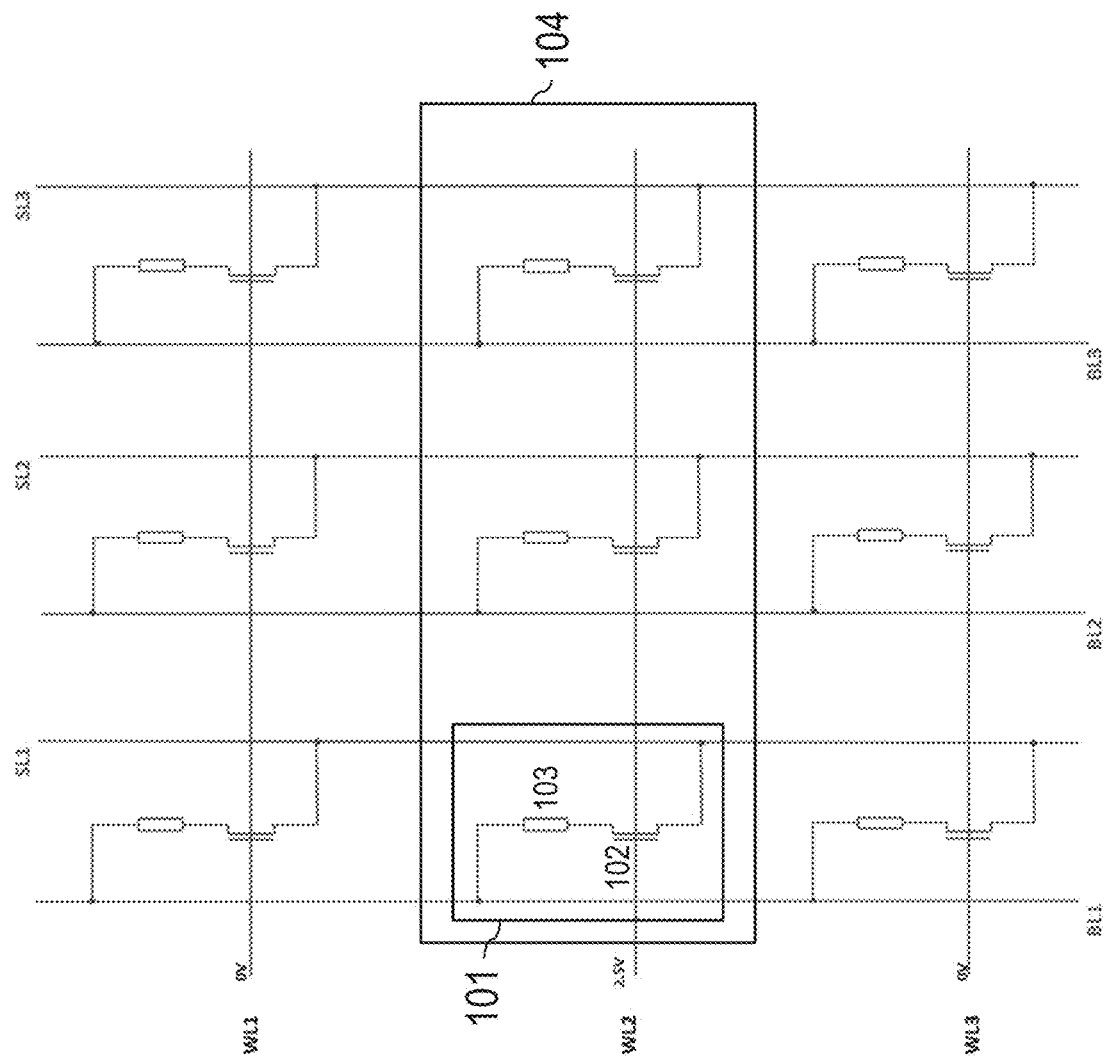
FIG. 1 shows a basic structure of an RRAM array comprising multiple memory cells that are arranged in a matrix-like structure comprising rows and columns.

FIG. 1 exemplarily shows a basic structure of an RRAM array comprising nine memory cells. A memory cell 101 comprises an NMOS 102 and an RRAM element 103 (which is exemplarily depicted as a resistor). The same structure applies for some and/or all the memory cells shown in the RRAM array of FIG. 1.

The nine memory cells are addressed via word lines WL1, WL2, WL3 and they are selected via bit-lines BL1, BL2, BL3 and source-lines SL1, SL2, SL3.

There are three operations that may be conducted for each memory cell: a set operation (also referred to as a forming operation), a reset operation and a read operation.

To select the memory cell 101, the word line WL2 is set to 2.5V (thereby also selecting memory cells (e.g., all memory cells) in the same line with the memory cell 101, which is indicated by a box 104). The remaining word lines WL1 and WL3 are not selected and are thus set to 0V.

Also, the bit-line BL1 and the source-line SL1 are selected to access the memory cell 101, whereas the other bit-lines BL2, BL3 and the other source-lines SL2, SL3 are not selected ("unselected").

In addition, the following signals may be applied to the bit-lines BL1 to BL3 and the source-lines SL1 to SL3 depending on the operation to be conducted on the memory cell 101:

|                  | BL1   | SL1   | BL2, BL3 | SL2, SL3 |
|------------------|-------|-------|----------|----------|
| set/form operation | 2.5 V | 0 V   | 1 V      | 1 V      |
| reset operation  | 0 V   | 2.5 V | 1 V      | 1 V      |
| read operation   | 0.2 V | 0 V   | 0 V      | 0 V      |

Hence, in case of setting/forming the memory cell 101, a current flows through the selected NMOS 102 by setting the bit-line voltage BL1 to 2.5V and the source-line voltage SL1 to 0V. The other bit-lines BL2 and BL3 and source-lines SL2 and SL3 may be connected to a voltage in the order of 1V to keep the gate-source voltage ($V_{GS}$) and the gate-drain voltage ($V_{GD}$) of the other transistors that are also selected by the word line WL2 on a low potential.

To conduct the read operation, an exemplary voltage of 0.2V is applied to the bit-line BL1 and the current is measured that flows through the RRAM element towards the source-line.

In case of a reset applied to the memory cell 101, the current flows in the reverse direction. This can be achieved by setting the bit-line voltage BL1 to 0V and the source-line voltage SL1 to 2.5V. The unselected bit-lines/source-lines are connected to the same voltages with the set/form operation above.

In case the memory cell 101 is to be read, the direction of the current through the NMOS is the same as in the setting/forming scenario, but the amplitude is smaller (e.g., significantly smaller). For example, the voltage applied to the bit-line BL1 may amount to 0.2V.

Figure 2:
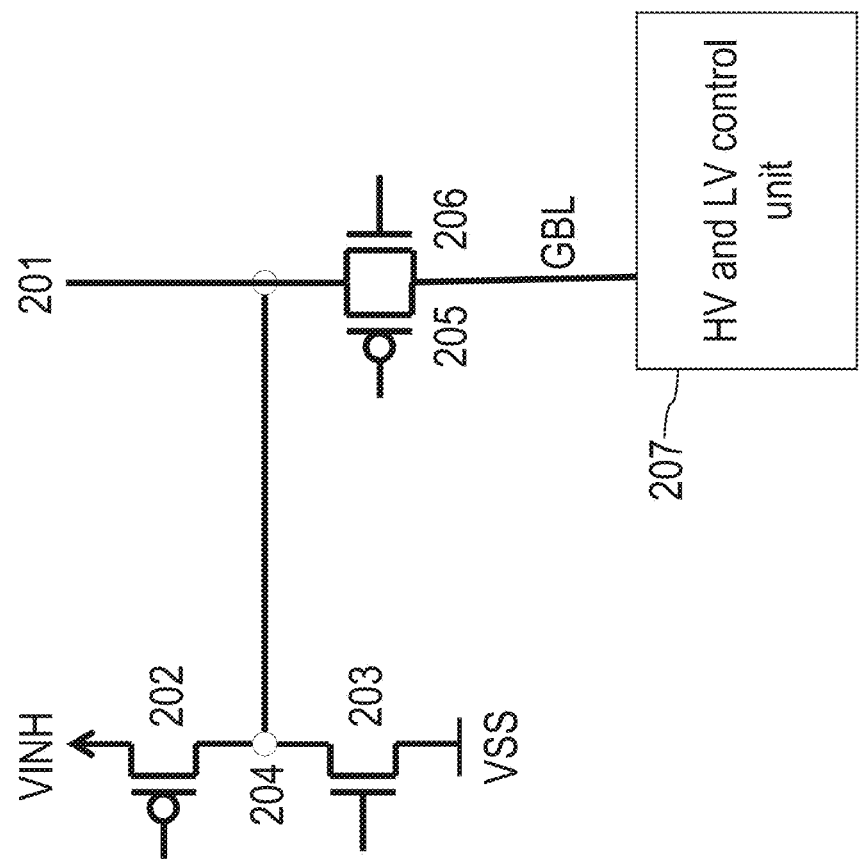
FIG. 2 shows an exemplary diagram comprising four HV devices to control a bit-line.

FIG. 2 shows an exemplary diagram comprising four high voltage devices that allow for a bit-line 201 to fulfill one, some and/or all of the following requirements: the bit-line 201 may be connected to ground GND (VSS), which is used for non-selected bit-lines during read operations; the bit-line 201 may be connected to a voltage VINH (e.g., 1.0V), which is used for non-selected bit-lines during the set/form operation or the reset operation; the bit-line 201 may be connected to a voltage GBL, which applies for a selected bit line, wherein the voltage GBL may be 0V, high voltage (e.g., 2.5V) or the voltage VINH (e.g., 0.2V or 1.0V).

The above may apply to the source-line accordingly.

The voltage VINH means a voltage between 0V and the voltage at a selected word line (e.g., 2.5V). Un-selected bit-lines and source-lines (e.g., all un-selected bit-lines and source-lines) are tied up to the voltage VINH in order to lower the voltage difference between the gate voltage of the select transistor and its related source and drain terminals to lower stress conditions (e.g., a voltage at un-selected bit lines and source-lines, such as all un-selected bit lines and source-lines, may set to the voltage VINH). Transistors (e.g., select-transistors) along the selected word-line may be stressed with Vgs and Vgd amounting to $V$(WL)−VINH=1.5V, if VINH=1V (wherein V(WL) is the voltage of the selected word-line). For pragmatic reason, VDD=1V may be used for VINH as it may be in a useful range and may be already available. The voltage of 0.2V in this example is the read-voltage applied from the sense-amplifier. This voltage may be different in other use-case scenarios and may depend on the sensing approach utilized.

In FIG. 2, a PMOS 202 is connected in series with an NMOS 203, wherein the source of the PMOS 202 is connected to the voltage VINH and the source of the NMOS 203 is connected to GND (also referred to as VSS). A node 204 is connected to the source of the PMOS 202 and to the source of the NMOS 203. The node 204 is also connected to the bit line 201 and to the drain of a PMOS 205 and to the drain of an NMOS 206. The source of the PMOS 205 and the source of the NMOS 206 are connected to each other and are connected to a "HV and LV control unit" 207.

It is noted that transistors shown in FIG. 2 (e.g., all transistors shown in FIG. 2) are designed to cope with HV and therefore may require a significant amount of area on a chip.

Figure 3:
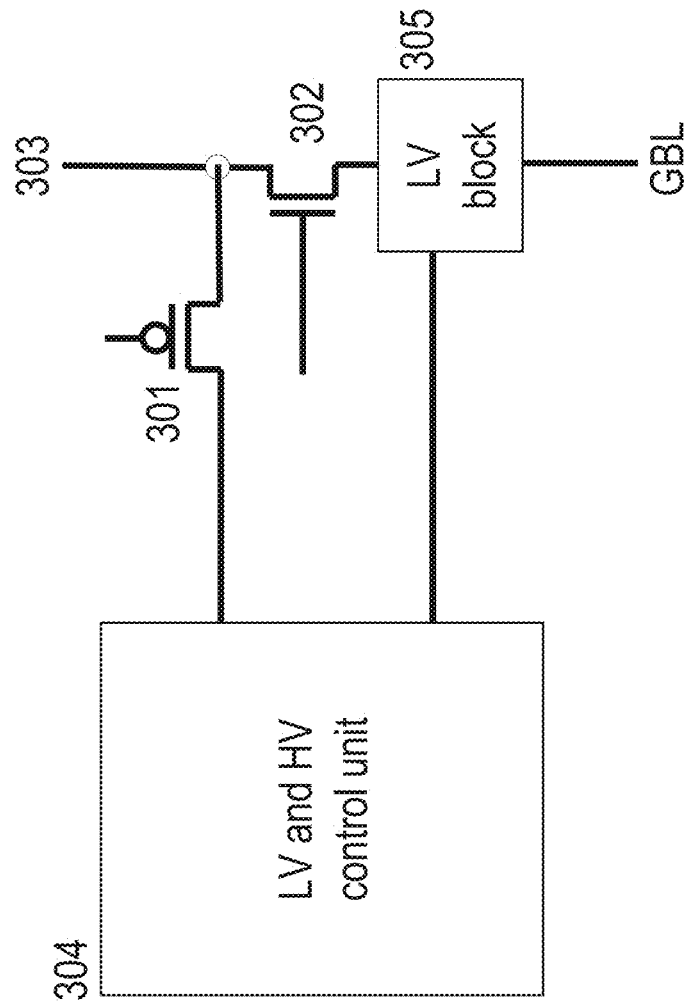
FIG. 3 shows a schematic diagram of a circuit that allows driving a bit-line using only two HV devices.

FIG. 3 shows a schematic diagram that provides the same features of setting voltages of a bit-line 303 comprising two HV devices (e.g., only two HV devices), a PMOS 301 and an NMOS 302. The drain of the PMOS 301 is connected to the bit-line 303 and to the drain of the NMOS 302. The source of the PMOS 301 is connected to a HV and LV control unit 304. Also, the HV and LV control unit 304 is connected to an LV block 305. The source of the NMOS 302 is also connected to the LV block 305.

A single HV and LV control unit 304 (e.g., only a single HV and LV control unit 304) may be provided per multiplexer, e.g., one block per 64 bit-lines. Hence, the HV and LV control unit 304 may be less relevant for area optimization purposes.

Alternatively and/or additionally, the LV block 305 as well as the two HV transistors 301 and 302 may be needed for each single bit-line. Advantageously, the LV block 305 is exposed to LV (e.g., the LV block 305 is exposed to LV only) and therefore does not need HV devices to function (e.g., the LV block 305 may not need any HV devices). This concept results in saving area (e.g., a significant amount of area) on the chip.

It is noted that the gates of the HV transistors are controlled in combination with the LV and HV control unit 304 and the LV block 305 such that form/set operations, reset operations and read operations may be conducted for individual memory cells of a matrix-shaped memory. This will be explained in more detail below.

In some examples, the NMOS 302 is used to "protect" the LV block 305 from voltages exceeding the LV range. Hence, the NMOS 302 may supply a voltage drop (e.g., of 0.6V) across its drain-source thereby reducing the voltage that is supplied to the LV block 305.

This approach can be applied to source-lines accordingly.

Figure 4:
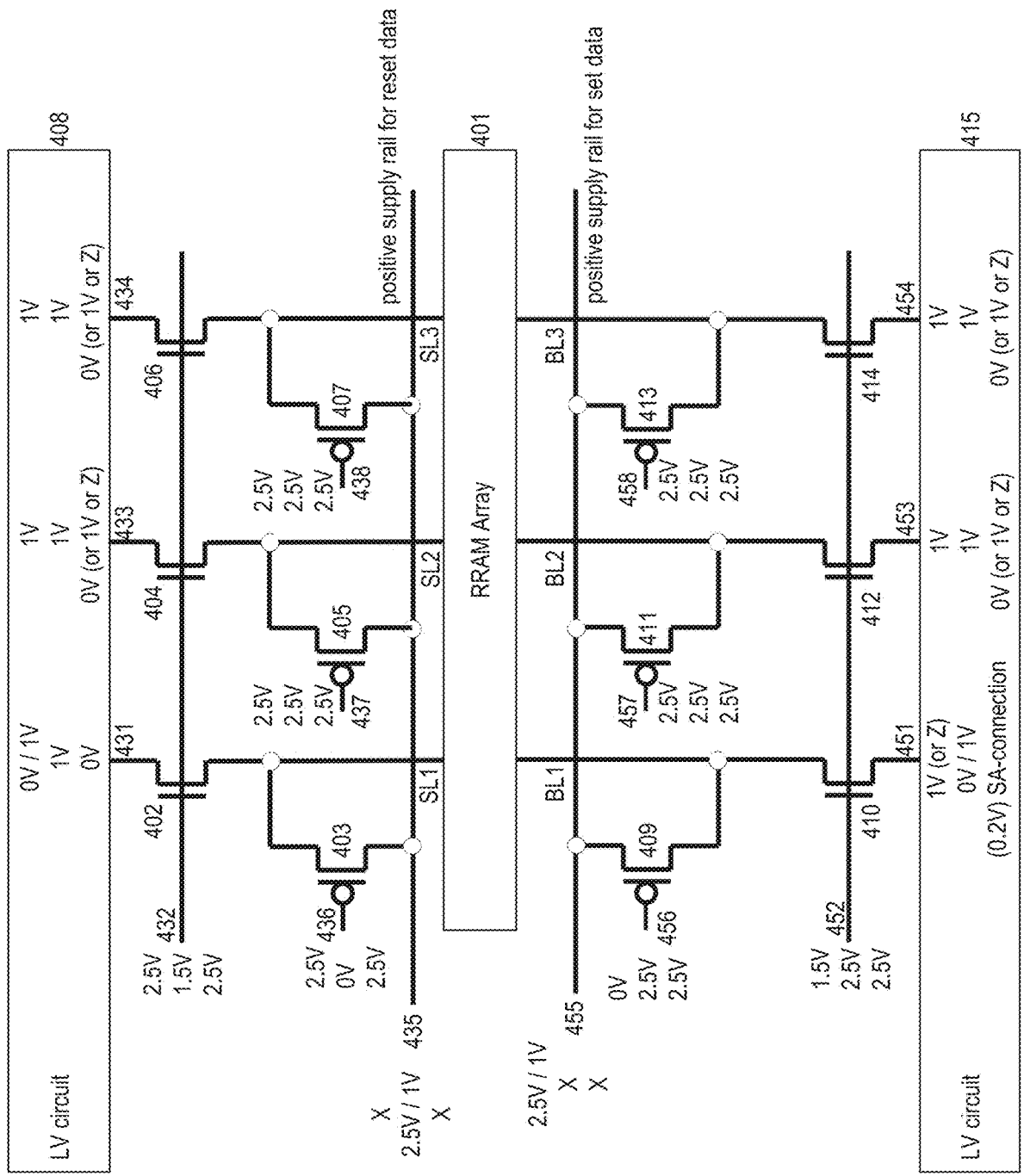
FIG. 4 shows a schematic diagram comprising portions of a multiplexer that operate in combination with an RRAM array.

FIG. 4 shows a schematic diagram comprising portions of a multiplexer that operate in combination with an RRAM array 401.

The diagram exemplarily comprises source-lines SL1, SL2 and SL3 with HV transistors 402 to 407. In addition, a LV circuit 408 is provided for driving these source-lines SL1 to SL3.

The diagram of FIG. 4 also comprises bit-lines BL1, BL2 and BL3 with HV transistors 409 to 414. In addition, a LV circuit 415 is provided for driving the bit-lines BL1 to BL3.

Hereinafter it is noted that the term "the transistor is connected between a node A and a node B" means that the drain of the transistor is connected to the node A and the source is connected to the node B or vice versa, dependent on the transistor being a PMOS or an NMOS. It is further noted that the transistors 402, 404, 406, 410, 412 and 414 are NMOS transistors (also referred to as "NMOS") and that the transistors 403, 405, 407, 409, 411 and 413 are PMOS transistors (also referred to as "PMOS").

It is noted that MOS transistors may be symmetric with regard to their source and drain, hence the respective source and drain may be swapped.

The NMOS 402 is connected between a node 431 and the source-line SL1 of the RRAM array 401. The NMOS 404 is connected between a node 433 and the source-line SL2 of the RRAM array 401. The NMOS 406 is connected between a node 434 and the source-line SL3 of the RRAM array 401.

The gates of the NMOS 402, 404 and 406 are connected to a node 432.

The PMOS 403 is connected between a node 435 and the source-line SL1, the PMOS 405 is connected between the node 435 and the source-line SL2 and the PMOS 407 is connected between the node 435 and the source-line SL3. The node 435 is the positive supply for conducting the reset operation.

The gate of the PMOS 403 is connected to a node 436, the gate of the PMOS 405 is connected to a node 437 and the gate of the PMOS 407 is connected to a node 438.

The NMOS 410 is connected between a node 451 and the bit-line BL1 of the RRAM array 401. The NMOS 412 is connected between a node 453 and the bit-line BL2 of the RRAM array 401. The NMOS 414 is connected between a node 454 and the bit-line BL3 of the RRAM array 401.

The gates of the NMOS 410, 412 and 414 are connected to a node 452.

The PMOS 409 is connected between a node 455 and the bit-line BL1, the PMOS 411 is connected between the node 455 and the bit-line BL2 and the PMOS 413 is connected between the node 455 and the bit-line BL3. The node 455 is the positive supply for conducting the set operation.

The gate of the PMOS 409 is connected to a node 456, the gate of the PMOS 411 is connected to a node 457 and the gate of the PMOS 413 is connected to a node 458.

The nodes introduced above may be connected to different voltages (and/or at least some of the nodes may be not connected to voltages) depending on the operation mode to be conducted. This is indicated in FIG. 4 by the triples of values that might be applied to the respective node/line. The upper value represents the set/form operation, the value in the middle represents the reset operation and the value at the bottom of the triple represents the read operation.

Hereinafter, the values are summarized for the respective lines/nodes:

| Node | set/form operation | reset operation | read operation |
|------|--------------------|-----------------|-----------------|
| 431 | 0 V/1 V | 1 V | 0 V |
| 433 | 1 V | 1 V | 0 V or 1 V or Z |
| 434 | 1 V | 1 V | 0 V or 1 V or Z |
| 432 | 2.5 V | 1.5 V | 2.5 V |
| 436 | 2.5 V | 0 V | 2.5 V |
| 437 | 2.5 V | 2.5 V | 2.5 V |
| 438 | 2.5 V | 2.5 V | 2.5 V |
| 435 | X | 2.5 V/1 V | X |
| 451 | 1 V or Z | 0 V/1 V | 0.2 V (sense-amplifier connection) |
| 453 | 1 V | 1 V | 0 V or 1 V or Z |
| 454 | 1 V | 1 V | 0 V or 1 V or Z |
| 452 | 1.5 V | 2.5 V | 2.5 V |
| 456 | 0 V | 2.5 V | 2.5 V |
| 457 | 2.5 V | 2.5 V | 2.5 V |
| 458 | 2.5 V | 2.5 V | 2.5 V |
| 455 | 2.5 V/1 V | X | X |

The notation "a/b", a and b being voltages, means the following: The voltage a is applied in the selected scenario, i.e. in case the memory cell is to be changed by an operation. The voltage b is used in case the selected cell shall not be changed. The latter is applicable in case the selected cell already has the desired state and no change is needed. It is also applicable in case the selected cell is to be changed, but in a delayed way: For example, 20 parallel multiplexers have selected a combination of BL/SL, but three (e.g., only three) can be written at one moment in time; the other multiplexers have to wait for their time window to write the memory cell, i.e. applying the voltage b until it is time to write the cell.

"X" means that the voltage at this node does not matter (e.g., the voltage at the node may not affect an operation being performed). "Z" means that the bit-line or the source-line is not connected. It is noted that the voltages shown above are only examples and may be changed based on a chosen technology or use-case scenario.

In the example shown in FIG. 4, the bit-line BL1 and the source-line SL1 are selected, whereas the remaining bit-lines BL2, BL3 and the remaining source-lines SL2, SL3 are unselected.

As shown in FIG. 4, the HV NMOS transistors share a common gate voltage.

Figure 5:
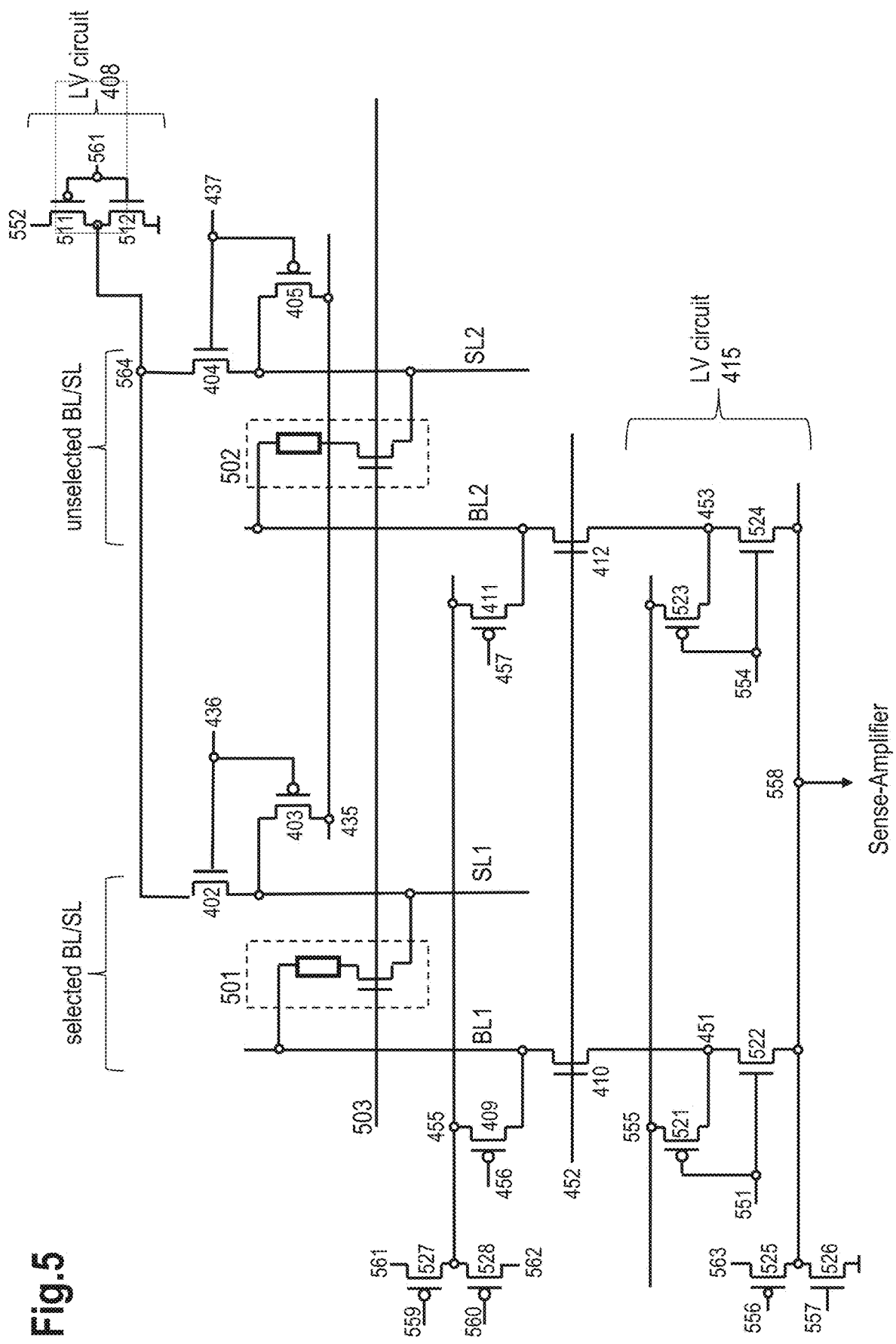
FIG. 5 shows a schematic diagram of a multiplexer structure accessing multiple memory cells, wherein the multiplexer structure comprises HV circuitry and LV circuitry.

FIG. 5 shows an exemplary scenario comprising a selected memory cell 501 next to one unselected memory cell 502. As explained above, there may be many unselected memory cells in addition to this memory cell 502.

In a real-world scenario, a single memory cell (e.g., only a single memory cell) may be selected from a multitude of memory cells (e.g., 64 memory cells) leaving the remaining memory cells (e.g., 63 remaining memory cells) unselected. This unselected state is exemplarily shown in the single memory cell 502, which is one out of these remaining unselected memory cells (e.g., 63 remaining unselected memory cells).

FIG. 5 also shows the HV circuitry as well as the LV circuitry in more detail. The HV circuitry and the LV circuitry may both be part of a multiplexer that enables different operations for different memory cells or an RRAM array. FIG. 5 also comprises a simplification of FIG. 4 regarding the connection of the transistors 402, 403 and 404, 405. Such simplification may optionally be applied to the transistors 409, 410 and 411, 412 as well.

Each of the memory cells 501 and 502 comprises an NMOS and a resistive element (see also FIG. 1 for further detail). The memory cells 501 and 502 are selected via a word line 503.

In FIG. 5 two bit-lines BL1, BL2 and two source-lines SL1, SL2 are shown. The bit-line BL1 and the source-line SL1 are used to select the memory cell 501 and the bit-line BL2 and the source-line SL2 are used to unselect the memory cell 502.

The NMOS 410 is connected between the bit-line BL1 and the node 451. An NMOS 522 is connected between the node 451 and a node 558.

A PMOS 521 is connected between a node 555 and the node 451 and the gate of the PMOS 521 and the gate of the NMOS 522 are connected to a node 551.

A PMOS 525 is connected between a node 563 and the node 558 and an NMOS 526 is connected between the node 558 and ground.

The gate of the PMOS 525 is connected to a node 556 and the gate of the NMOS 526 is connected to a node 557.

As indicated above, the gate of the NMOS 410 and the gate of the NMOS 412 are connected to the node 452.

The PMOS 409 is connected between the node 455 and the bit-line BL1. The gate of the PMOS 409 is connected to the node 456.

A PMOS 527 is connected between a node 561 and the node 455 and a PMOS 528 is connected between the node 455 and a node 562.

The gate of the PMOS 527 is connected to a node 559 and the gate of the PMOS 528 is connected to a node 560.

The PMOS 403 is connected between the source-line SL1 and the node 435. The NMOS 402 is connected between a node 564 and the source-line SL1. The gate of the NMOS 402 and the gate of the PMOS 403 are connected to the node 436.

A PMOS 511 is connected between a node 552 and the node 564 and an NMOS 512 is connected between the node 564 and ground. The gate of the PMOS 511 and the gate of the NMOS 512 are connected to a node 561.

The NMOS 412 is connected between the bit-line BL2 and a node 453.

A PMOS 523 is connected between the node 555 and the node 453. An NMOS 524 is connected between the node 453 and the node 558. The gate of the PMOS 523 and the gate of the NMOS 524 are connected to a node 554.

The node 558 is connected to a sense-amplifier (not shown).

The PMOS 411 is connected between the node 455 and the bit-line BL2. The gate of the PMOS 411 is connected to the node 457.

The NMOS 404 is connected between a node 564 and the source-line SL2. The PMOS 405 is connected between the source-line SL2 and the node 435. The gate of the NMOS 404 and the gate of the PMOS 405 are connected to the node 437.

The LV circuit 408 thus comprises the transistors 511 and 512 and the LV circuit 415 comprises the transistors 521 to 526.

As indicated above with regard to FIG. 4, the transistors 409 to 412 and the transistors 402 to 405 are HV transistors. The transistors 527 and 528 are HV transistors that are part of a HV control circuit which may be provided (e.g., provided once) for a multitude of bit-lines, e.g., for one, some and/or all bit-lines of a memory module comprising, e.g., 64 memory cells.

Hereinafter, exemplary values are summarized for the respective lines/nodes:

| Node | set/form operation, selected bit-line/source-line to be set Scenario 1a | set/form operation, selected bit-line/source-line not to be set Scenario 1b | reset operation, selected bit-line/source-line to be reset Scenario 2a | reset operation, selected bit-line/source-line not to be reset Scenario 2b | read operation Scenario 3 |
|---|---|---|---|---|---|
| 561 | 1 V | 0 V | 0 V | 0 V | 1 V |
| 552 | 1 V | 1 V | 1 V | 1 V | 1 V |
| 564 | 0 V | 1 V | 1 V | 1 V | 0 V |
| 436 | 2.5 V | 2.5 V | 0 V | 0 V | 2.5 V |
| 437 | 0 V | 0 V | 2.5 V | 2.5 V | 2.5 V |
| SL1 | 0 V | 1 V | 2.5 V | 1 V | 0 V |
| SL2 | 1 V | 1 V | 1 V | 1 V | 0 V |
| 435 | 1 V | 1 V | 2.5 V | 1 V | X |
| 503 | 2 V | 2 V | 2 V | 2 V | 2 V |
| 559 | 0 V | 2.5 V | 2.5 V | 2.5 V | 2.5 V |
| 560 | 2.5 V | 0 V | 2.5 V | 2.5 V | 2.5 V |
| 561 | 2.5 V | 2.5 V | 2.5 V | 2.5 V | 2.5 V |
| 562 | 1 V | 1 V | 1 V | 1 V | 1 V |
| 455 | 2.5 V | 1 V | Z | Z | Z |
| 456 | 0 V | 0 V | 2.5 V | 2.5 V | 2.5 V |
| BL1 | 2.5 V | 1 V | 0 V | 1 V | 0.2 V |
| 457 | 2.5 V | 2.5 V | 2.5 V | 2.5 V | 2.5 V |
| BL2 | 1 V | 1 V | 1 V | 1 V | Z (0 V) |
| 452 | 1.5 V | 1.5 V | 1.5 V | 1.5 V | 1.5 V |
| 555 | 1 V | 1 V | 1 V | 1 V | Z |
| 451 | 1 V | 1 V | 0 V | 1 V | 0.2 V |
| 551 | 0 V | 0 V | 1 V | 1 V | 1 V |
| 453 | 1 V | 1 V | 1 V | 1 V | Z |
| 554 | 0 V | 0 V | 0 V | 0 V | 0 V |
| 563 | 1 V | 1 V | 1 V | 1 V | 1 V |
| 556 | 1 V | 1 V | 1 V | 0 V | 1 V |
| 557 | 1 V | 1 V | 1 V | 0 V | 0 V |
| 558 | 0 | 0 | 0 | 1 V | 0.2 V (*) |

(*) This voltage is defined by the attached sense amplifier (SA). Voltage levels other than 0.2 V may be used in other applications. Here, the SA controls the input to a defined level (e.g., 0.2 V) and measures the current (e.g., the SA may measure the current after the SA controls the input to the defined level). The attached SA may be high-ohmic at its input in case the SA is off (e.g., a resistance of the input of the SA may exceed a threshold resistance when the SA is off). Also, the SA when switched off may be capable of tolerating other voltages at its input without drawing current.

In scenario 1a the bit-line/source-line is chosen for setting/forming, whereas in scenario 1b the (already) selected bit-line/source-line is kept unchanged.

In scenario 2a the bit-line/source-line is chosen for resetting, whereas in scenario 2b the (already) selected bit-line/source-line is kept unchanged.

Scenario 3 shows the read operation that generates a voltage amounting to 0.2V at the node 558 towards the sense-amplifier.

It is noted that for the scenario 2a, the voltage of 2.5V at the node 435 may be generated via a similar arrangement as is shown by the transistors 527 and 528: two PMOS transistors may be arranged in series, wherein the upper node (upper compared to node 561) is connected to 2.5V and the lower node (lower compared to node 562) is connected to 1V; the gate of the upper PMOS (upper compared to node 559) is connected to 0V and the gate of the lower PMOS (lower compared to node 560) is connected to 2.5V.

With regard to the scenario 2b, the voltage of 1V at the node 435 may be generated accordingly, whereas the gate of the upper PMOS (upper compared to node 559) is connected to 2.5V and the gate of the lower PMOS (lower compared to node 560) is connected to 0V.

It is noted that with regard to scenarios 1a and 1b, the voltages applied to the nodes 559, 560 and 561 are used to make a distinction between the selected bit-line/source-line memory cell to be changed or not. Alternatively and/or additionally, the voltages applied to the nodes 436, 437, 456 and 457 are used to make a distinction between selected and unselected bit-line/source-line combination.

It is further noted that with regard to the scenarios 2a and 2b, the voltages applied to the nodes 556, 557 and 435 are used to make a distinction between the selected bit-line/source-line memory cell to be changed or not. Alternatively and/or additionally, the voltages applied to the nodes 436, 437, 551 and 554 are used to make a distinction between selected and unselected bit-line/source-line combination.

In addition, with regard to the read operation (scenario 3), the voltages applied to the nodes 551 and 554 are used to make a distinction between selected and unselected bit-line/source-line combination.

Example: Shared Source-Line

It is an option that multiple bit-lines may share a single source-line. This bears the advantage that the complexity and the area on a chip required for the multiplexer can be reduced (e.g., significantly reduced). Also, a reduced amount of source-lines may allow increasing the width of the metal lines thereby reducing the resistance of such lines.

An example shown below associates a single source-line with two bit-lines.

Figure 6:
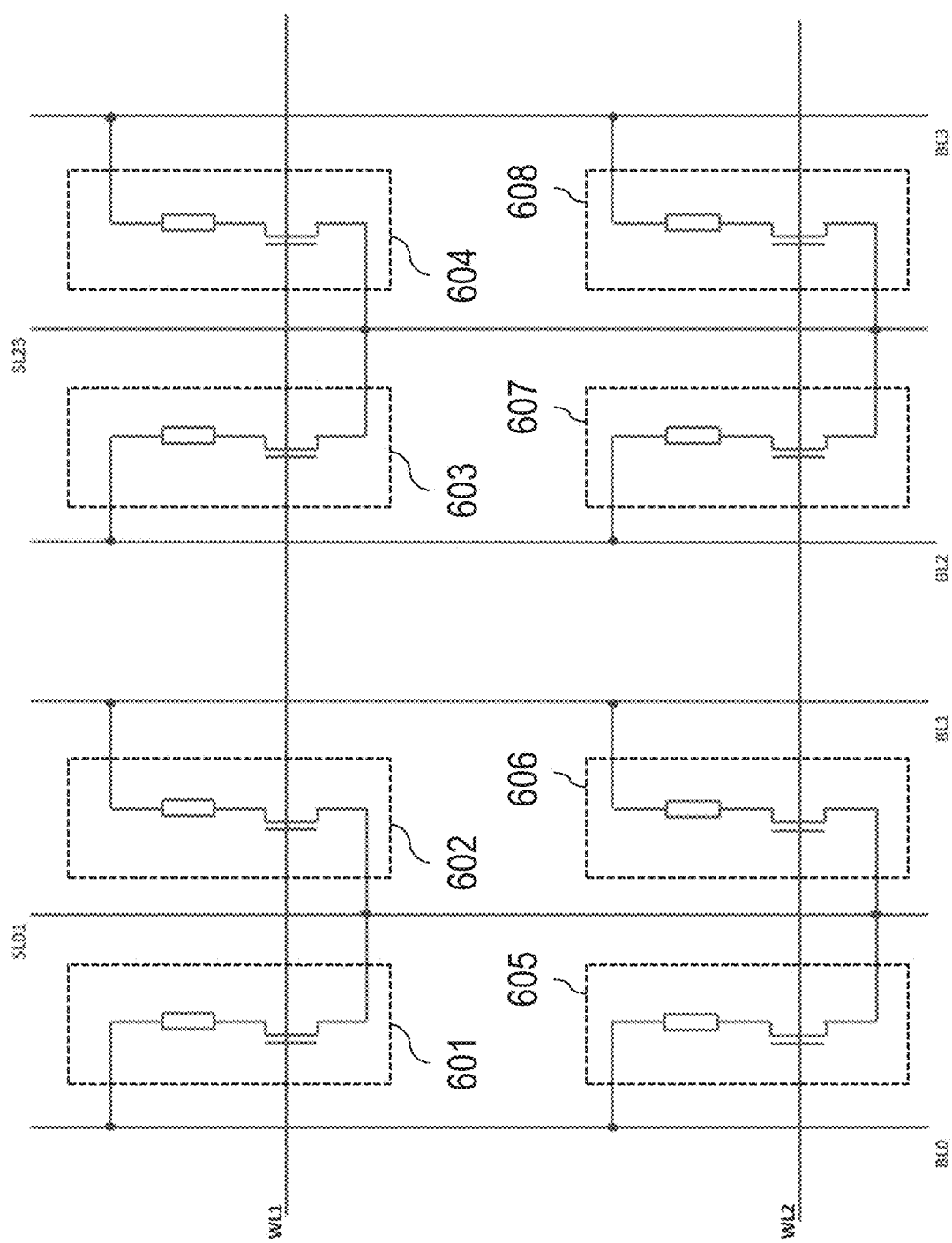
FIG. 6 shows a basic structure of another RRAM array comprising eight memory cells, wherein a single source-line is shared for two bit-lines.

FIG. 6 exemplarily shows a basic structure of another RRAM array comprising eight memory cells 601 to 608. As is explained with regard to FIG. 1, each memory cell comprises an NMOS and an RRAM element (which is exemplarily depicted as a resistor).

One of the memory cells can be addressed (e.g., selected or unselected) via word lines WL1, WL2, bit-lines BL0, BL1, BL2 and source-lines SL01, SL23.

As mentioned above, three operations may be conducted for each memory cell 601 to 608: a set/form operation, a reset operation or a read operation.

In the example shown in FIG. 6, the memory cell 601 (e.g., only the memory cell 601) may be selected. Hence, the word line WL1 is selected and the other word lines (here word line WL2) are unselected. Also, the source-line SL01 is selected and the other source-lines (here source-line SL23) are unselected. However, by selecting the source-line SL01, both of the memory cells 601 and 602 may be active. To select only the memory cell 601, the bit-line BL0 is selected and the bit-line BL1 is unselected. Of course, the other bit-lines BL2 and BL3 are also unselected.

In addition, the following signals may be applied to the word lines, the source-lines and the bit-lines depending on the operation to be conducted on the memory cell 601:

|  | Set/form operation | Reset operation | Read operation |
| --- | --- | --- | --- |
| WL1 |  | 2.5 V |  |
| WL2 |  | 0 V |  |
| BL0 | 2.5 V | 0 V | 0.2 V |
| BL1 | 0 V | 2.5 V | 0 V |
| BL2 | 1 V | 1 V | 0 V |
| BL3 | 1 V | 1 V | 0 V |
| SL01 | 0 V | 2.5 V | 0 V |
| SL23 | 1 V | 1 V | 0 V |

The concept of the shared source-line(s) comprises additional conditions for an unselected bit-line and a selected source-line (in the example shown in FIG. 6 the bit-line BL0 being the selected bit-line, the bit-line BL1 being the unselected bit-line and the source-line SL01 being the selected source-line): In some examples, the bit-line voltages are configured to avoid (e.g., substantially avoid) cell current (e.g., any cell current) flowing through the memory cell 602 (e.g., the bit-line voltage may be configured such that cell current does not flow through the memory cell 602 and/or such that an amount of cell current flowing through the memory cell 602 is less than a threshold).

Figure 7:
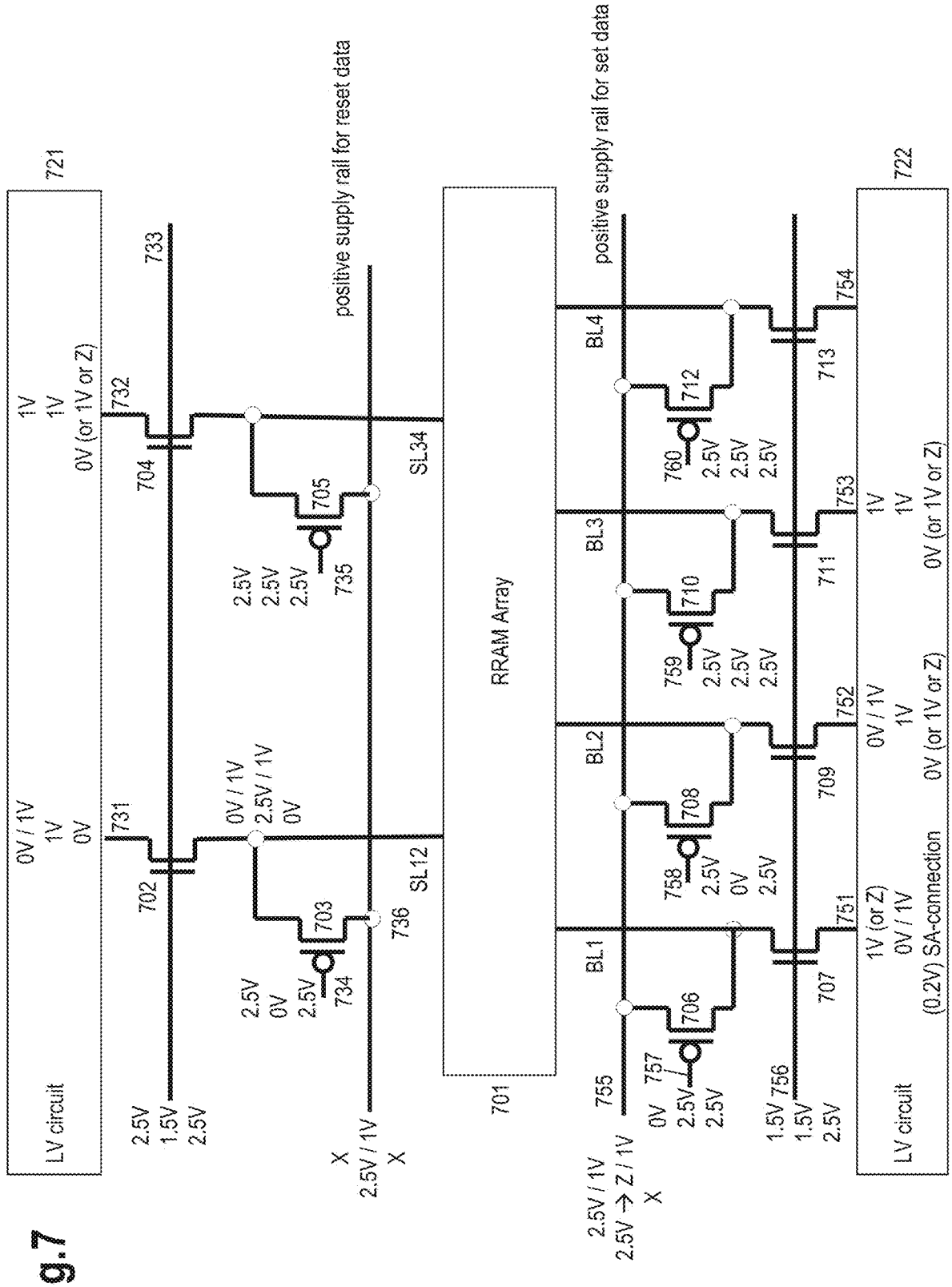
FIG. 7 shows a schematic diagram comprising portions of a multiplexer that operate in combination with an RRAM array utilizing one source-line per two bit-lines.

FIG. 7 shows a schematic diagram comprising portions of a multiplexer that operate in combination with an RRAM array 701 utilizing one source-line per two bit-lines.

The diagram exemplarily comprises source-lines SL12, SL34 with HV transistors 702 to 705. In addition, a LV circuit 721 is provided for driving these source-lines SL12 and SL34.

The diagram of FIG. 7 also comprises bit-lines BL1, BL2, BL3 and BL4 with HV transistors 706 to 713. In addition, a LV circuit 722 is provided for driving the bit-lines BL1 to BL4.

The transistors 702, 704, 707, 709, 711 and 713 are NMOS transistors (also referred to as "NMOS") and the transistors 703, 705, 706, 708, 710 and 712 are PMOS transistors (also referred to as "PMOS").

The NMOS 702 is connected between a node 731 and the source-line SL12 of the RRAM array 701. The NMOS 704 is connected between a node 732 and the source-line SL34 of the RRAM array 701.

The gates of the NMOS 702 and 704 are connected to a node 733.

The PMOS 703 is connected between a node 736 and the source-line SL12 and the PMOS 705 is connected between the node 736 and the source-line SL34.

The gate of the PMOS 703 is connected to a node 734 and the gate of the PMOS 705 is connected to a node 735.

The NMOS 707 is connected between a node 751 and the bit-line BL1 of the RRAM array 701. The NMOS 709 is connected between a node 752 and the bit-line BL2 of the RRAM array 701. The NMOS 711 is connected between a node 753 and the bit-line BL3 of the RRAM array 701. The NMOS 713 is connected between a node 754 and the bit-line BL4 of the RRAM array 701.

The gates of the NMOS 707, 709, 711 and 713 are connected to a node 756.

The PMOS 706 is connected between a node 755 and the bit-line BL1, the PMOS 708 is connected between the node 755 and the bit-line BL2, the PMOS 710 is connected between the node 755 and the bit-line BL3 and the PMOS 712 is connected between the node 755 and the bit-line BL4.

The gate of the PMOS 706 is connected to a node 757, the gate of the PMOS 708 is connected to a node 758 the gate of the PMOS 710 is connected to a node 759 and the gate of the PMOS 712 is connected to a node 760.

The nodes introduced above may be connected to different voltages (and/or at least some of the nodes may be not connected to voltages) depending on the operation mode to be conducted. This is indicated in FIG. 7 by the triples of values that might be applied to the respective node/line. The upper value represents the set/form operation, the value in the middle represents the reset operation and the value at the bottom of the triple represents the read operation.

Hereinafter, the values are summarized for the respective lines/nodes:

| Node | set/form operation | reset operation | read operation |
| --- | --- | --- | --- |
| 731 | 0 V/1 V | 1 V | 0 V |
| 732 | 1 V | 1 V | 0 V or 1 V or Z |
| 733 | 2.5 V | 1.5 V | 2.5 V |
| 734 | 2.5 V | 0 V | 2.5 V |
| 735 | 2.5 V | 2.5 V | 2.5 V |
| 736 | X | 2.5 V/1 V | X |
| SL12 | 0 V/1 V | 2.5 V/1 V | 0 V |
| 751 | 1 V or Z | 0 V/1 V | 0.2 V (sense-amplifier connection) |
| 752 | (0 V or Z)/1 V | 1 V or Z | 0 V or 1 V or Z |
| 753 | 1 V | 1 V | 0 V or 1 V or Z |
| 754 | 1 V | 1 V | 0 V or 1 V or Z |
| 755 | 2.5 V/1 V | (2.5 V → Z)/1 V | X |
| 756 | 1.5 V | 1.5 V | 2.5 V |
| 757 | 0 V | 2.5 V | 2.5 V |
| 758 | 2.5 V | 0 V | 2.5 V |
| 759 | 2.5 V | 2.5 V | 2.5 V |
| 760 | 2.5 V | 2.5 V | 2.5 V |

0V/1V means that 0V is selected for set or reset or change the state of the memory cell and 1V is selected in case the memory is not supposed to be set (the memory cell may remain as it is). The particular BL/SL combination is selected by the multiplexer in addition to a selected WL; hence, a single memory cell is selected. Whether the selected memory cell is supposed to be set or not or reset, may depend on the current state of this memory cell (it may already be in set-state) and on the applied data (it might be that the particular element is supposed to stay in the reset state).

"(2.5V→Z)/1V" means "2.5V/1V" in an ideal case. As 2.5V on the bit-line BL2 may be slightly different to the concurrent 2.5V at the source-line SL12, a static current through the unselected memory cell may occur. Hence, it may be an option to switch the node 755 for a short duration (e.g., for some nano seconds) to 2.5V and change to the high ohmic state. The bit-line BL2 then drifts to the voltage of the source-line SL12 through the memory cell with a small charging current (but without any static current, for example). This is beneficial, because static currents may cause unwanted changes in the state of the memory cell.

"X" means that any voltage in a range from 0V to 2.5V (the circuit may cope with these voltages), such as 1V or 2.5V. "Z" means that the bit-line or the source-line is not connected. It is noted that the voltages shown above are only examples and may be changed based on a chosen technology or use-case scenario.

In the example shown in FIG. 7, the bit-line BL1 and the source-line SL12 are selected, whereas the remaining bit-lines BL2 to BL4 are unselected.

Figure 8:
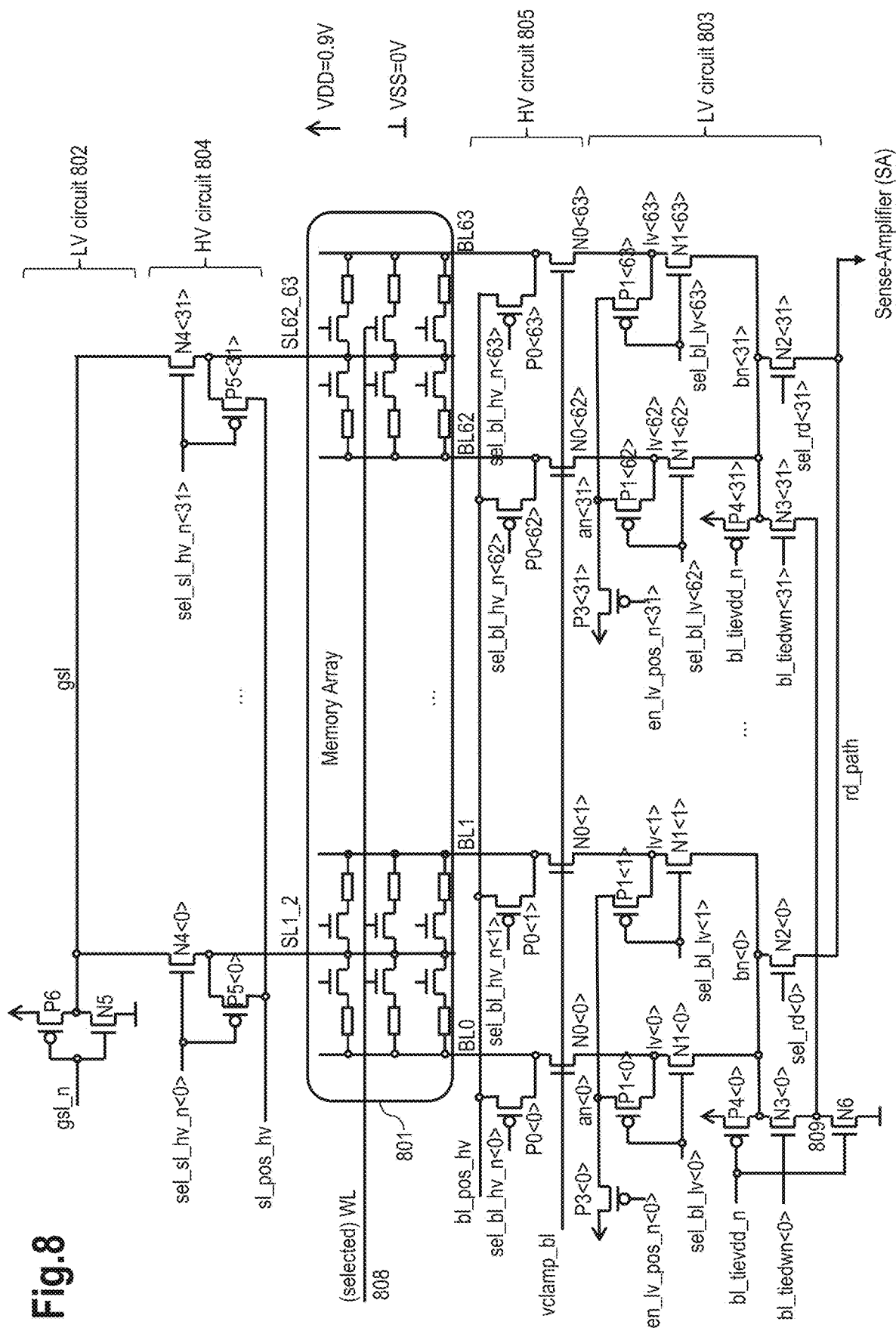
FIG. 8 shows the concept of FIG. 7 for 64 memory cells in more detail.

FIG. 8 shows the concept of FIG. 7 for 64 memory cells in more detail, including an LV circuit 802 and an HV circuit 804 for driving 32 source-lines SL1_2 to SL62_63, and/or an LV circuit 803 and an HV circuit 805 for driving the 64 bit-lines BL0 to BL63.

The LV circuit 802 comprises a PMOS P6 and an NMOS N5, both being LV transistors.

The HV circuit 804 comprises 32 PMOS P5, referred to as P5<0> to P5<31>, and 32 NMOS N4, referred to as N4<0> to N4<31>.

The PMOS P6 is connected between VDD (which may be 0.9V) and a node gsl, the NMOS N5 is connected between the node gsl and ground. The gate of the PMOS P6 and of the NMOS N5 is connected to a node gsl_n.

The NMOS N4<0> is connected between the node gsl and the source-line SL1_2. The PMOS p5<0> is connected between the source-line SL1_2 and a node sl_pos_hv. The gate of the NMOS N4<0> and the gate of the PMOS P5<0> are connected to a node sel_sl_hv_n<0>.

It is noted that the reference sign mentioned herein may contain a number in brackets, e.g., "<0>". This refers to the fact that the referenced node or transistor may be provided multiple times (e.g., there may be multiple of the referenced node or transistor). With regard to the 32 source-lines SL1_2 to SL62_63, also 32 pairs of HV transistors N4<0>, P5<0> to N4<31> to P5<31> are provided, wherein their gates are connected to the nodes sel_sl_hv_n<0> to sel_sl_hv_n<31>. Hence, the portion <i> with i=0, . . . , 32 or i=0, . . . 61 addresses one out of many nodes or transistors.

Hence, with regard to the $32^{nd}$ HV transistors of the HV circuit 804 the following applies: The NMOS N4<31> is connected between the node gsl and the source-line SL62_63. The PMOS p5<31> is connected between the source-line SL62_63 and the node sl_pos_hv. The gate of the NMOS N4<31> and the gate of the PMOS P5<31> are connected to a node sel_sl_hv_n<31>.

The source-lines SL1_2 to SL62_63 are connected to a memory array 801. A word line 808 is connected to the memory array 801 to select a line of memory cells (as explained above in more detail).

Applying the naming scheme introduced above, the LV circuit 803 comprises 64 PMOS P1, 64 NMOS N1, 32 PMOS P3, 32 PMOS P4, 32 NMOS N3 and 32 NMOS N2.

The HV circuit 805 comprises 64 PMOS P0 and 64 NMOS N0.

The HV circuit 805 and the LV circuit 803 may be grouped for each two subsequent bit-lines.

For the bit-lines BL0 and BL1, which are connected to the memory array 801, the following applies:

The PMOS P0<0> is connected between a node bl_pos_hv and the bit-line BL0. The gate of the PMOS P0<0> is connected to a node sel_bl_hv_n<0>.

The NMOS N0<0> is connected between the bit-line BL0 and a node lv<0>. The gate of the NMOS N0<0> is connected to a node vclamp_bl.

The PMOS P3<0> is connected between VDD and a node an<0>. The gate of the PMOS P3<0> is connected to a node en_lv_pos_n<0>.

The PMOS P1<0> is connected between the node an<0> and the node lv<0>. The NMOS N1<0> is connected between the node lv<0> and a node bn<0>. The gate of the PMOS P1<0> and the gate of the NMOS N1<0> are connected to a node sel_bl_lv<0>.

The PMOS P4<0> is connected between VDD and the node bn<0> and the NMOS N3<0> is connected between the node bn<0> and a node 809. A NMOS N6 is connected between the node 809 and ground. The gate of the PMOS P4<0> is connected to a node bl_tievdd_n. This node bl_tievdd_n is also connected to the gate of the NMOS N6. The gate of the NMOS N3<0> is connected to a node bl_tiedwn<0>.

The NMOS N2<0> is connected between the node bn<0> and a node rd_path. The gate of the NMOS N2<0> is connected to a node sel_rd<0>.

The node rd_path is further connected to a sense-amplifier (not shown).

The PMOS P0<1> is connected between the node bl_pos_hv and the bit-line BL1. The gate of the PMOS P0<1> is connected to a node sel_bl_hv_n<1>.

The NMOS N0<1> is connected between the bit-line BL1 and a node lv<1>. The gate of the NMOS N0<1> is connected to the node vclamp_bl.

The PMOS P1<1> is connected between the node an<0> and the node lv<1>. The NMOS N1<1> is connected between the node lv<1> and the node bn<0>. The gate of the PMOS P1<1> and the gate of the NMOS N1<1> are connected to a node sel_bl_lv<1>.

This approach is applied to any succeeding group of two bit-lines accordingly. For the last two bit-lines BL62 and BL63, therefore the following applies:

The PMOS P0<62> is connected between the node bl_pos_hv and the bit-line BL62. The gate of the PMOS P0<62> is connected to a node sel_bl_hv_n<62>.

The NMOS N0<62> is connected between the bit-line BL62 and a node lv<62>. The gate of the NMOS N0<62> is connected to the node vclamp_bl.

The PMOS P3<31> is connected between VDD and a node an<31>. The gate of the PMOS P3<31> is connected to a node en_lv_pos_n<31>.

The PMOS P1<62> is connected between the node an<31> and the node lv<62>. The NMOS N1<62> is connected between the node lv<62> and a node bn<31>. The gate of the PMOS P1<62> and the gate of the NMOS N1<62> are connected to a node sel_bl_lv<62>.

The PMOS P4<31> is connected between VDD and the node bn<31> and the NMOS N3<31> is connected between the node bn<31> and the node 809. The gate of the PMOS P4<31> is connected to the node bl_tievdd_n. The gate of the NMOS N3<31> is connected to a node bl_tiedwn<31>.

The NMOS N2<31> is connected between the node bn<31> and the node rd_path. The gate of the NMOS N2<31> is connected to a node sel_rd<31>.

The PMOS P0<63> is connected between the node bl_pos_hv and the bit-line BL63. The gate of the PMOS P0<63> is connected to a node sel_bl_hv_n<63>.

The NMOS N0<63> is connected between the bit-line BL63 and a node lv<63>. The gate of the NMOS N0<63> is connected to the node vclamp_bl.

The PMOS P1<63> is connected between the node an<31> and the node lv<63>. The NMOS N1<63> is connected between the node lv<63> and the node bn<31>. The gate of the PMOS P1<63> and the gate of the NMOS N1<63> are connected to a node sel_bl_lv<63>.

FIG. 9 shows a table comprising exemplary voltages at the nodes/lines shown in FIG. 8 for the various operation modes, i.e. read operation, set/form operation and reset operation.

The table shows multiple lines 921 to 937 and columns 901 to 912.

Columns 901 to 903 refer to an idle read operation, wherein no bit-line has yet been selected.

Columns 904 to 906 refer to a read operation with a bit-line being selected for conducting the read operation. If a device is powered up and the RRAM memory module is in a state of doing nothing, then it is read-idle. This read-idle state is similar to the read state; a read-operation can be triggered instantly.

Columns 907 to 909 refer to a set/form operation for the selected bit-line.

Columns 910 to 912 refer to a reset operation for the selected bit-line.

As explained above, a single source-line is used for two bit-lines. Hence, selecting the source-line results in selecting a double of bit-lines. This "selected double" is indicated by columns 901/902, 904/905, 907/908 and 910/911. Within the "selected double" there is a selected bit-line (indicated by columns 901, 904, 907, 910) and an unselected bit-line (indicated by columns 902, 905, 908, 911). The remaining bit-lines are also unselected—as is shown in the columns 903, 906, 909 and 912.

The line 924 of the table indicates the desired (target) voltages for the respective bit-lines (BL) and the line 925 of the table shows the desired (target) voltages for the respective source-lines (SL).

Further, the table shows in lines 926 to 928 how this is achieved by applying voltages to the respective nodes/lines for the source-lines (upper part of FIG. 8).

Also, the table shows in lines 929 to 937 how this is achieved by applying voltages to the respective nodes/lines for the bit-lines (lower part of FIG. 8).

The notation "<31:0>" refers to any of <0> to <31>. Accordingly, the notation "<63:0>" refers to any of <0> to <63>.

It is noted that VDD refers to a voltage amounting to 0.9V or 1V and "0" refers to 0V (also referred to as ground or VSS).

VCLAMP corresponds to a voltage level which is an exemplary threshold voltage of the HV-NMOS higher than VDD. The voltage level of VCLAMP may be an on-chip generated voltage which may vary with, e.g., temperature, process-corner or other effects. If VCLAMP is applied to the gate of an HV-NMOS, its source can be tied to VDD and its drain to a higher voltage, e.g., 2.5V without any channel current above the leakage current level (e.g., less than 1 µA). If the source of this HV-NMOS is left floating and maintaining the conditions (gate-voltage at VCLAMP, drain-voltage at 2.5V) the source charges up to VDD-level.

In the examples shown in FIG. 4 (see, e.g., node 452), FIG. 7 (see, e.g., node 756) and FIG. 8 (see, e.g., HV circuit 804), the HV-NMOS devices separate the LV- and HV-domain.

Figure 10:
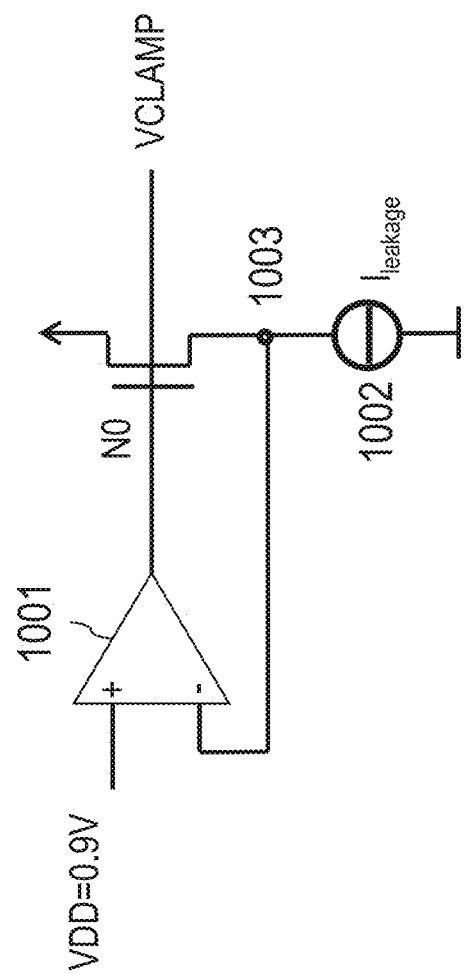
FIG. 10 shows an exemplary circuit comprising components to generate the voltage level VCLAMP.

An embodiment of the VCLAMP voltage generator is shown in FIG. 10.

"Z" means that the bit-line or the source-line is not connected (high-impedance).

In addition, there may be a common N-well area for the HV transistors which may be at suitable voltage levels (e.g., 1.5V or 2.5V).

The voltage levels shown in round brackets are applied if the selected memory cell is not to be changed (e.g., the selected memory cell has already the intended state, or is waiting to be written).

The node bl_pos_hv (line 936 of the table) shows for the reset operation a value "2.5V/Z" indicating that there is an initial pulse set to 2.5V, which is left floating at a high impedance Z.

FIG. 10 shows an exemplary circuit comprising components to generate the voltage level VCLAMP.

The voltage VCLAMP may depend on one or more parameters, e.g., the temperature. Beneficially, VCLAMP may be generated on-chip. The NMOS N0 may be a transistor matched with the NMOS N0<0> to N0<64> as well as the NMOS N4<0> to N4<31> as shown in FIG. 8.

The voltage VDD amounting in this example to 0.9V is fed to the positive input of an operational amplifier 1001. The output of the operational amplifier 1001 is connected to the gate of the NMOS N0 thereby also providing the voltage VCLAMP. The NMOS N0 is connected between a high voltage, e.g., 2.5V and a node 1003. The negative input of the operational amplifier 1001 is connected to the node 1003. A current source 1002 is connected between the node 1003 and ground. The current source 1002 provides a small current in the range of device channel-leakage or slightly higher (e.g., 1 μA). The voltage at the negative input of the operational amplifier 1001 settles at a value close to VDD (e.g., the voltage at the negative input of the operational amplifier 1001 may be equal to VDD, or a difference between the voltage and VDD may be less than a threshold difference). The gate-source voltage of the NMOS N0 settles at a value close to the threshold-voltage of N0 (Vth) (e.g., the gate-source voltage of the NMOS N0 may be equal to the threshold-voltage, or a difference between the gate-source voltage and the threshold-voltage may be less than a threshold difference). As the source voltage of the NMOS N0 may be approximately VDD, the voltage of VCLAMP may be approximately VDD+Vth.

Although various exemplary embodiments of the present disclosure have been disclosed, it will be apparent to those skilled in the art that various changes and modifications can be made which will achieve some of the advantages of the present disclosure without departing from the spirit and scope of the present disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the present disclosure may be achieved in all software implementations, using the appropriate processor instructions, and/or in hybrid implementations that utilize a combination of hardware logic and software logic to achieve the same results. Such modifications to the present disclosure are intended to be covered by the appended claims.

The invention claimed is:

1. A multiplexer for controlling access to memory cells of a memory, the multiplexer comprising:
one or more first strings controlling access to source-lines of the memory, wherein a first string of the one or more first strings comprises a first set of two high voltage transistors and a first plurality of low voltage transistors; and
one or more second strings controlling access to bit-lines of the memory, wherein a second string of the one or more second strings comprises a second set of two high voltage transistors and a second plurality of low voltage transistors.

2. The multiplexer according to claim 1, wherein:
a high voltage control unit is configured to drive the first set of two high voltage transistors of the first string and the second set of two high voltage transistors of the second string; and
a low voltage control unit is configured to drive the first plurality of low voltage transistors of the first string and the second plurality of low voltage transistors of the second string.

3. The multiplexer according to claim 1, wherein at least one of:
the first set of two high voltage transistors of the first string are arranged such that a first high voltage transistor of the first set of two high voltage transistors is arranged to apply a first voltage to the memory and a second high voltage transistor of the first set of two high voltage transistors is arranged in series with the first plurality of low voltage transistors to protect the first plurality of low voltage transistors from the first voltage; or
the second set of two high voltage transistors of the second string are arranged such that a third high voltage transistor of the second set of two high voltage transistors is arranged to apply a second voltage to the memory and a fourth high voltage transistor of the second set of two high voltage transistors is arranged in series with the second plurality of low voltage transistors to protect the second plurality of low voltage transistors from the second voltage.

4. The multiplexer according to claim 1, wherein at least one of:
the first plurality of low voltage transistors of the first string are arranged such that one or more source-lines of the source-lines can be selected and first voltages can be applied to at least some of the source-lines; or
the second plurality of low voltage transistors of the second string are arranged such that one or more bit-lines of the bit-lines can be selected and second voltages can be applied to at least some of the bit-lines.

5. The multiplexer according to claim 1, wherein the first string and the second string are used to access one or more memory cells of the memory and conduct a set/form operation, a reset operation or a read operation.

6. The multiplexer according to claim 1, wherein the memory is a resistive random-access memory (RRAM).

7. The multiplexer according to claim 1, wherein:
the memory cells are arranged in a matrix structure;
the one or more first strings comprise a string for each row of memory cells of the memory cells; and
the one or more second strings comprise a string for each row of memory cells of the memory cells.

8. The multiplexer according to claim 1, wherein:
the memory cells are arranged in a matrix structure;
the one or more first strings comprise a string for each set of N strings of the one or more second strings;
N is a multiple of two; and
two bit-lines share one source-line.

9. The multiplexer according to claim 1, wherein:
the multiplexer is arranged at least one of on the same chip as the memory or in the same package as the memory.

10. The multiplexer according to claim 1, wherein:
each high voltage transistor of the first set of two high voltage transistors is configured to endure a voltage higher than 1.5 volts (V); and each high voltage transistor of the second set of two high voltage transistors is configured to endure a voltage higher than 1.5 V.

11. The multiplexer according to claim 1, wherein:
each low voltage transistor of the first plurality of low voltage transistors is limited to a voltage of less than 1.5 volts (V); and
each low voltage transistor of the second plurality of low voltage transistors is limited to a voltage of less than 1.5 V.

12. A method for operating a multiplexer controlling access to memory cells of a memory, the multiplexer comprising:
a first string controlling access to source-lines of the memory, wherein the first string comprises a first set of two high voltage transistors and a first plurality of low voltage transistors; and
a second string controlling access to bit-lines of the memory, wherein the second string comprises a second set of two high voltage transistors and a second plurality of low voltage transistors, the method comprising:
applying voltages to the first string and the second string to conduct one or more operations on one or more memory cells of the memory, the one or more operations comprising at least one of:
a read operation;
a set/form operation; or
a reset operation.

13. A multiplexer for controlling access to memory cells of a memory, the multiplexer comprising:
one or more first strings controlling access to source-lines of the memory, wherein a first string of the one or more first strings comprises a first set of two high voltage transistors and a first plurality of low voltage transistors; and
one or more second strings controlling access to bit-lines of the memory, wherein a second string of the one or more second strings comprises a second set of two high voltage transistors and a second plurality of low voltage transistors, wherein:
the memory is a resistive random-access memory (RRAM); and
at least one of the first string or the second string are configured to conduct a set/form operation, a reset operation or a read operation.

14. The multiplexer according to claim 13, wherein:
a high voltage control unit is configured to drive the first set of two high voltage transistors of the first string and the second set of two high voltage transistors of the second string; and
a low voltage control unit is configured to drive the first plurality of low voltage transistors of the first string and the second plurality of low voltage transistors of the second string.

15. The multiplexer according to claim 13, wherein at least one of:
the first set of two high voltage transistors of the first string are arranged such that a first high voltage transistor of the first set of two high voltage transistors is arranged to apply a first voltage to the memory and a second high voltage transistor of the first set of two high voltage transistors is arranged in series with the first plurality of low voltage transistors to protect the first plurality of low voltage transistors from the first voltage; or
the second set of two high voltage transistors of the second string are arranged such that a third high voltage transistor of the second set of two high voltage transistors is arranged to apply a second voltage to the memory and a fourth high voltage transistor of the second set of two high voltage transistors is arranged in series with the second plurality of low voltage transistors to protect the second plurality of low voltage transistors from the second voltage.

16. The multiplexer according to claim 13, wherein at least one of:
the first plurality of low voltage transistors of the first string are arranged such that one or more source-lines of the source-lines can be selected and first voltages can be applied to at least some of the source-lines; or
the second plurality of low voltage transistors of the second string are arranged such that one or more bit-lines of the bit-lines can be selected and second voltages can be applied to at least some of the bit-lines.

17. The multiplexer according to claim 13, wherein:
the memory cells are arranged in a matrix structure;
the one or more first strings comprise a string for each row of memory cells of the memory cells; and
the one or more second strings comprise a string for each row of memory cells of the memory cells.

18. The multiplexer according to claim 13, wherein:
the memory cells are arranged in a matrix structure;
the one or more first strings comprise a string for each set of N strings of the one or more second strings;
N is a multiple of two; and
two bit-lines share one source-line.

19. The multiplexer according to claim 13, wherein:
the multiplexer is arranged at least one of on the same chip as the memory or in the same package as the memory.

20. The multiplexer according to claim 13, wherein:
each high voltage transistor of the first set of two high voltage transistors is configured to endure a voltage higher than 1.5 volts (V);
each high voltage transistor of the second set of two high voltage transistors is configured to endure a voltage higher than 1.5 V;
each low voltage transistor of the first plurality of low voltage transistors is limited to a voltage of less than 1.5 V; and
each low voltage transistor of the second plurality of low voltage transistors is limited to a voltage of less than 1.5 V.

* * * * *

UNITED STATES PATENT AND TRADEMARK OFFICE
CERTIFICATE OF CORRECTION

PATENT NO. : 11,562,789 B2
APPLICATION NO. : 17/117713
DATED : January 24, 2023
INVENTOR(S) : David Mueller et al.

Page 1 of 1

It is certified that error appears in the above-identified patent and that said Letters Patent is hereby corrected as shown below:

On the Title Page

Item (30) Foreign Priority Information should read:
Application Number: 102019133737.2
Country: DE
Filing Date: December 10, 2019

Signed and Sealed this
Twenty-eighth Day of February, 2023

Katherine Kelly Vidal
*Director of the United States Patent and Trademark Office*